US006800133B1

(12) United States Patent
Kim et al.

(10) Patent No.: US 6,800,133 B1
(45) Date of Patent: Oct. 5, 2004

(54) PROCESS FOR GROWING A MAGNESIUM OXIDE FILM ON A SILICON (100) SUBSTRATE COATED WITH A CUBIC SILICON CARBIDE BUTTER LAYER

(75) Inventors: Yun-Soo Kim, Daejeon (KR); Sun-Sook Lee, Daejeon (KR), Lee; Sung-Yong Lee, Seokuipo-si (KR)

(73) Assignee: Korea Research Institute of Chemical Technology (KR)

( * ) Notice: Subject to any disclaimer, the term of this patent is extended or adjusted under 35 U.S.C. 154(b) by 107 days.

(21) Appl. No.: 10/343,475

(22) PCT Filed: Aug. 17, 2000

(86) PCT No.: PCT/KR00/00914

§ 371 (c)(1),
(2), (4) Date: Jan. 29, 2003

(87) PCT Pub. No.: WO02/13246

PCT Pub. Date: Feb. 14, 2002

(30) Foreign Application Priority Data

Aug. 3, 2000 (KR) ........................................ 2000-44955

(51) Int. Cl.$^7$ ................................................ C30B 25/18
(52) U.S. Cl. ............................. 117/89; 117/90; 117/94; 117/95; 117/106; 117/944; 428/688
(58) Field of Search ............................... 117/90, 94, 95, 117/106; 428/688

(56) References Cited

U.S. PATENT DOCUMENTS

| | | | | | |
|---|---|---|---|---|---|
| 5,323,023 A | * | 6/1994 | Fork | ........................... | 505/235 |
| 5,418,216 A | * | 5/1995 | Fork | ........................... | 505/473 |
| 5,482,003 A | * | 1/1996 | McKee et al. | ............... | 117/108 |
| 5,776,621 A | * | 7/1998 | Nashimoto | .................... | 428/688 |
| 5,830,270 A | * | 11/1998 | McKee et al. | .............. | 117/106 |
| 6,046,464 A | * | 4/2000 | Schetzina | ..................... | 257/96 |
| 6,118,571 A | * | 9/2000 | Wessels et al. | ............. | 359/245 |
| 6,122,429 A | * | 9/2000 | Wessels et al. | ............. | 385/130 |
| 6,605,151 B1 | * | 8/2003 | Wessels et al. | ............. | 117/103 |

* cited by examiner

*Primary Examiner*—Robert Kunemund
(74) *Attorney, Agent, or Firm*—Anderson Kill & Olick, PC

(57) ABSTRACT

A CVD method for growing MgO on a Si(100) substrate coated with a cubic SiC buffer layer provides a single-crystalline MgO film having improved quality.

5 Claims, No Drawings

PROCESS FOR GROWING A MAGNESIUM OXIDE FILM ON A SILICON (100) SUBSTRATE COATED WITH A CUBIC SILICON CARBIDE BUTTER LAYER

This application is a 371 of PCT/KR00/00914 filed Aug. 17, 2000.

FIELD OF THE INVENTION

The present invention relates to a chemical vapor deposition (CVD) process for growing a single-crystalline magnesium oxide film having an improved quality on a silicon (100) substrate having a coated cubic silicon carbide buffer layer.

BACKGROUND OF THE INVENTION

Magnesium oxide is a transparent and chemically stable material having good electric properties and does not undergo a phase transition even at a high temperature up to its melting temperature of 2852° C. Magnesium oxide has been used as a substrate for preparing thereon films of a number of inorganic compounds, i.e., various oxides such as cuprate-based high-$T_c$ superconductors, lithium niobate and barium titanate, as well as nitrides such as gallium nitride and niobium nitride. Also, it is known that films of such oxides and nitrides having excellent properties can be grown on a magnesium oxide film coated on the surface of quartz, silicon, gallium arsenide or sapphire.

There have been reported various methods to prepare a magnesium oxide film on the surface of a single crystal substrate. For example, DeSisto et al. disclose an MgO thin film deposited on sapphire or sapphire coated with alumina by ultrasonic spray pyrolysis [W. J. DeSisto and R L. Henry, "Preparation and characterization of MgO thin films deposited by spray pyrolysis of Mg(2,4-pentanedionate)$_2$", J Crest. Growth 109, 314–317 (1991)]. Also, Yoon et al. and Tarsa et al. describe MgO films deposited on Si and GaAs, respectively, by a sol-gel method [J. G. Yoon, Y. J. Kwag, and H. K. Kim, "Structural Characterization of Sol-Gel Derived MgO Thin Film on Si Substrate", J *Korean Phys. Soc.* 31, 613–616 (1997); and E. J. Tarsa, X. H. Wu, J. P. Ibbetson, J. S. Speck, and J. J. Zinck, "Growth of epitaxial MgO films on Sb-passivated (001)GaAs: Properties of the MgO/GaAs interface", *Appl. Phys. Lett.* 66, 3588–3590 (1995)]; Fork et al. and Nashimoto et al., MgO films formed on Si and GaAs, respectively, by pulsed laser deposition [D. K. Fork, F. A. Ponce, J. C. Tramontana, and T. H. Geballe, "Epitaxial MgO on Si(001) for Y—Ba—Cu—O thin film growth by pulsed laser deposition", *Appl. Phys. Lett.* 58, 2294–2296 (1991); D. K. Fork and G. B. Anderson, "Epitaxial MgO on GaAs(111) as a buffer layer for z-cut epitaxial lithium niobate", *Appl. Phys. Lett.* 63, 1029–1031 (1993); and K. Nashimoto, D. K. Fork, and T. H. Geballe, "Epitaxial growth of MgO on GaAs(001) for growing epitaxial BaTiO$_3$ thin films by pulsed laser deposition", *Appl. Phys. Lett.* 60, 1199–1201 (1992)]; Bruley et al. and Kaneko et al., MgO films deposited on GaAs and Si, respectively, by magnetron sputtering [J. Bruley, S. Stemmer. F. Ernst, M. Ruhle, W. Y. Hsu, and R. Raj, "Nanostructure and chemistry of a (100) MgO/(100)GaAs interface", *Appl. Phys. Lett.* 65, 564–566 (1994); and Y. Kaneko, N. Mikoshiba, and T. Yamashita, "Preparation of MgO Thin Films by RF Magnetron Sputtering", *Jpn. J. Appl. Phys.* 30, 1091–1092 (1991)]; and Hung et al. and Masuda et al., MgO films deposited on GaAs and/or Si, by electron-beam evaporation [L. S. Hung, R. Zheng, and T. N. Blanton, "Epitaxial growth of MgO on (100)GaAs using ultrahigh vacuum electron-beam evaporation", *Appl. Phys. Lett.* 60, 3129–3131 (1992); and A. Masuda and K. Nashinioto, "Orientation of MgO Thin Films on Si(100) and GaAs(100) Prepared by Electron-Beam Evaporation", *Jpn. Appl. Phys.* 33, L793–L796 (1994)].

For epitaxially growing a film of good quality, one needs to consider such factors as lattice match between the substrate and the film to be deposited thereon, crystal structures and the nature of chemical bonds thereof. However, when magnesium oxide (lattice constant: 0.4213 nm) whose lattice oxygen and magnesium atoms respectively are of a face-centered cubic structure is grown on a silicon single crystal (lattice constant: 0.5431 nm) having the diamond structure, it is difficult to obtain an MgO film of good quality due to a very large lattice mismatch of −22.4%.

SUMMARY OF THE INVENTION

Accordingly, it is an object of the present invention to provide a method for growing a single-crystalline MgO film having improved quality on a Si(100) substrate.

In accordance with one aspect of the present invention, there is provided a method for growing a single-crystalline MgO film on a Si(100) substrate, which comprises depositing a cubic SiC buffer layer on the substrate and forming a MgO film on the SiC layer using a chemical vapor deposition process.

DETAILED DESCRIPTION OF THE INVENTION

The formation of a SiC buffer layer on a Si(100) substrate in accordance with the present invention may be performed by a conventional CVD method, for example, by bringing the vapor of a precursor of silicon carbide, if necessary, in combination with an appropriate carrier gas, into contact with the surface of a substrate heated to a temperature ranging from 800 to 1100° C.

Exemplary precursors which may be employed in forming the SiC film include a mixture of a silicon-containing compound such as $SiCl_4$, $SiHCl_3$ and $SiH_4$ and a carbon-containing compound such as $CH_4$ and $C_3H_8$, tetramethylsilane, dimethylisopropylsilane, 1,2-bissilylethane, a linear silaalkane and a mixture thereof [C. E. Morosanu, Thin Films by Chemical Vapor Deposition, Elsevier (1990); U.S. Pat. No. 4,923,716; and Korean Patent No. 96-12710]. Among these precursors, preferred are dimethylisopropylsilane and a linear silaalkane having alternatingly-bonded carbon and silicon atoms, and more preferred are dimethylisopropylsilane, 1,3-disilabutane ($H_3SiCH_2SiH_2CH_3$), 1,3,5-trisilapentane ($H_3SiCH_2SiH_2CH_2SiH_3$), 2,4,6-trisilaheptane ($H_3CSiH_2CH_2SiH_2CH_2SiH_2CH_3$) and 2,6-dimethyl-2,4,6-trisilaheptane ($H_3CSiH(CH_3)CH_2SiH_2CH_2SiH(CH_3)CH_3$).

In accordance with the present invention, a MgO film may be deposited on the SiC buffer layer by a conventional CVD method. In a preferred embodiment of the present invention, the MgO film may be prepared by way of bringing the vapor of an alkylmagnesium alkoxide, if necessary, with the aid of a carrier gas, e.g., argon, hydrogen and nitrogen, into contact with the surface of the buffer layer heated to a temperature ranging from 600 to 900° C.

Representative examples of the alkylmagnesium alkoxide which may be employed in the present invention include methylmagnesium t-butoxide and methylmagnesium isopropoxide.

Cubic silicon carbide (lattice constant: 0.4358 nm) is a chemically stable material having a high melting point of 2830° C. and is composed of two face-centered cubic frames of carbon and silicon atoms which interpenetrate each other by ¼ length of the unit cell towards the x, y and z-directions. Such crystal structure of silicon carbide is fully compatible with that of magnesium oxide, and a lattice mismatch of magnesium oxide with silicon carbide is only −3.33%. In addition, due to the fact that silicon carbide and the silicon substrate have similar bond characteristics, and the ratio of the lattice constant of silicon carbide to that of silicon is 4:5, close to 1:1, it is possible to epitaxially grow silicon carbide on silicon.

Further, in practicing the present invention, an on-axis Si(100) substrate of which surface is parallel to the (100) face may be preferably cut so that the surface becomes tilted at an angle ranging from 1 to 10° towards the [110] direction (off-axis). This cutting generates narrow terraces on the surface of the substrate and encourages the step flow growth thereon of a SiC layer having an improved quality. Such a SiC film is conducive to the epitaxial growth of an MgO film having an excellent crystallization property.

The single-crystalline MgO coated Si(100) prepared by the inventive method can be advantageously used in many applications due to the excellent properties of the MgO film, and is thus included within the scope of the present invention.

The following Examples and Comparative Example are given for the purpose of illustration only, and are not intended to limit the scope of the invention.

EXAMPLE 1

1,3-disilabutane was evaporated at room temperature and decomposed on a Si(100) substrate at 950° C. for 25 minutes to deposit a cubic SiC buffer layer thereon. The deposition was carried out until a distinct RHEED (reflection high energy electron diffraction) pattern of cubic SiC was attained. Then, methylmagnesium t-butoxide was evaporated at room temperature with a hydrogen carrier gas and decomposed on the SiC buffer layer at 850° C. for 3 hours to deposit a MgO film thereon.

The MgO film thus obtained was characterized as follows: The RHEED pattern showed several regular diffraction points, and X-ray diffraction pattern, a single peak corresponding to MgO(200) at $2\theta=42.98°$. Further, the X-ray rocking curve of the film showed a full-width at half maximum (FWRM) of 0.9, and pole figure analysis thereof, four poles of 90° symmetry. Also, the elemental composition of the film surface measured by X-ray photoelectron spectroscopy corresponded to an atomic ratio of Mg:O=1.0:1.1, which coincided with that of a magnesium oxide single crystal.

EXAMPLE 2

The procedure of Example 1 was repeated except that methylmagnesium t-butoxide was decomposed at 800° C. to deposit a MgO film on a Si(100) substrate coated with a SiC buffer layer.

The MgO film thus obtained was characterized as follows: The RHEED pattern showed several regular diffraction points, and X-ray diffraction pattern, a single peak corresponding to MgO(200) at $2\theta=42.98°$. Further, the X-ray rocking curve of the film showed a full-width at half maximum (FWHM) of 1.5, and pole figure analysis thereof, four poles of 90° symmetry. Also, the elemental composition of the film surface measured by X-ray photoelectron spectroscopy corresponded to an atomic ratio of Mg:O=1.0:1.1, which coincided with that of a magnesium oxide single crystal.

EXAMPLE 3

1,3-disilabutane was evaporated at room temperature and decomposed on a Si(100) substrate which was cut so that its surface became tilted by an angle of 40 towards the [110] direction, at 940° C. for 25 minutes to deposit a cubic SiC buffer layer thereon. Then, methylmagnesium t-butoxide was evaporated at 140° C. with a hydrogen carrier gas and decomposed on the SiC buffer layer at 850° C. for 3 hours to deposit a MgO film thereon.

The MgO film thus obtained was characterized as follows: The RHEED pattern showed several regular diffraction points, and X-ray diffraction pattern, a single peak corresponding to MgO(200) at $2\theta=42.98°$. Further, the X-ray rocking curve of the film showed a full-width at half maximum (FWHM) of 0.55°, and pole figure analysis thereof, four poles of 90° symmetry. Also, the elemental composition of the film surface measured by X-ray photoelectron spectroscopy corresponded to an atomic ratio of Mg:O=1.0:1.1, which coincided with that of a magnesium oxide single crystal.

EXAMPLE 4

The procedure of Example 3 was repeated except for employing a Si(100) substrate which was cut so that its surface became tilted by an angle of 6° towards the [110] direction.

The MgO film thus obtained was characterized as follows: The RHEED pattern showed several regular diffraction points, and X-ray diffraction pattern, a single peak corresponding to MgO(200) at $2\theta=42.98°$. Further, the X-ray rocking curve of the film showed a full-width at half maximum (FWHM) of 0.62°, and pole figure analysis thereof, four poles of 90° symmetry. Also, the elemental composition of the film surface measured by X-ray photoelectron spectroscopy corresponded to an atomic ratio of Mg:O=1.0:1.1, which coincided with that of a magnesium oxide single crystal.

COMPARATIVE EXAMPLE 1

The procedure of Example 1 was repeated except that a Si(100) substrate having no SiC buffer layer was used to deposit a MgO film directly on the Si(100) substrate.

The RHEED pattern of the MgO film thus obtained showed no distinct diffraction spots. The X-ray diffraction pattern of the film showed several peaks corresponding to MgO(111), MgO(200) and MgO(220) at $2\theta=36.96°$, $42.98°$ and $62.36°$, respectively. These results mean that the MgO film is polycrystalline.

As described above, in accordance with the present invention, a single-crystalline MgO film having an improved quality may be grown on a Si(100) substrate coated with a cubic SiC buffer layer.

While the embodiments of the subject invention have been described and illustrated, it is obvious that various changes and modifications can be made therein without departing from the spirit of the present invention which should be limited only by the scope of the appended claims.

What is claimed is:

1. A method for growing a single-crystalline MgO film on a Si(100) substrate, which comprises depositing a cubic SiC buffer layer on the substrate and forming a MgO film on the SiC layer using a chemical vapor deposition process.

2. The method of claim 1, wherein the surface of the Si(100) substrate is tilted by an angle ranging from 1 to 10° towards the [110] direction.

3. The method of claim 1, wherein the SiC buffer layer is formed using a precursor selected from the group consisting of dimethylisopropylsilane, 1,3-disilabutane, 1,3,5-trisilapentane, 2,4,6-trisilaheptane and 2,6-dimethyl-2,4,6-trisilaheptane.

4. The method of claim 1, wherein the MgO film is formed using an alkylmagnesium alkoxide precursor.

5. A Si(100) substrate having a coated single-crystalline MgO film prepared by claim 1.

* * * * *

UNITED STATES PATENT AND TRADEMARK OFFICE
CERTIFICATE OF CORRECTION

PATENT NO. : 6,800,133 B1  
APPLICATION NO. : 10/343475  
DATED : October 5, 2004  
INVENTOR(S) : Yun-Soo Kim et al.

It is certified that error appears in the above-identified patent and that said Letters Patent is hereby corrected as shown below:

Title,  
The word "Butter" should read "Buffer" --

Column 1,  
Title, "Butter" should read "Buffer"--  
Line 37, "*Crest. Growth* 109, 314-317" should read "*Cryst. Growth* 109, 309-313"  
Line 39, "J. G. Yoon" should read "J.-G. Yoon"  
Line 59, "W. Y." should read "W.-Y."  
Line 66, "L.S. Hung, R." should read "L.S. Hung, L.R."

Column 2,  
Line 3, "Nashinioto" should read "Nashimoto", replace "ni" with "m"  
Line 5, Add "J." between "*Jpn.*" and "*Appl.*"

Column 3,  
Line 12, Delete "close to 1:1" --  
Line 48, "FWRM" should read "FWHM"--  
Line 48, Add the degree symbol after "0.9"  
Line 66, Add the degree symbol after "1.5"

Column 4,  
Line 9, "40 towards--" should read "4 degrees towards--"

Signed and Sealed this

Fifteenth Day of August, 2006

JON W. DUDAS  
*Director of the United States Patent and Trademark Office*